United States Patent [19]

Marsh

[11] Patent Number: 4,677,323

[45] Date of Patent: Jun. 30, 1987

[54] FIELD-EFFECT TRANSISTOR CURRENT SWITCHING CIRCUIT

[75] Inventor: Douglas G. Marsh, Freehold, N.J.

[73] Assignee: American Telephone & Telegraph Co., AT&T Bell Laboratories, Murray Hill, N.J.

[21] Appl. No.: 757,335

[22] Filed: Jul. 22, 1985

[51] Int. Cl.[4] .................... H03K 17/687; H03F 3/45; G05F 3/16
[52] U.S. Cl. .................... 307/571; 330/257; 323/315; 307/575; 307/577
[58] Field of Search ............... 323/315, 316, 312, 317; 330/257, 288; 307/571, 584, 297, 575, 577

[56] References Cited

U.S. PATENT DOCUMENTS

| | | | |
|---|---|---|---|
| 3,878,482 | 4/1975 | Schowe, Jr. ............. | 331/108 D |
| 4,284,958 | 8/1981 | Pryor et al. ............. | 330/257 |
| 4,544,878 | 10/1985 | Beale et al. ............. | 323/316 |
| 4,550,284 | 10/1985 | Sooch ..................... | 323/315 |

FOREIGN PATENT DOCUMENTS 2140639  11/1984  United Kingdom ............. 330/257

Primary Examiner—Stanley D. Miller
Assistant Examiner—Trong Quang Phan
Attorney, Agent, or Firm—Volker R. Ulbrich; Gregory C. Ranieri

[57] ABSTRACT

An MOS current steering circuit (10) includes a current mirror arrangement with an input branch (12) and an output branch (16). In the input branch, the conduction channels of a current-limiting transistor (M1) and a current mirror input transistor (M3) are connected in series with each other between a first power supply voltage node V+ and one side of a current source (14). The other side of the current source and the gate of the current-limiting transistor are connected to another supply voltage node (V−). In the output branch, a current mirror output transistor (M4) has one side of its conduction channel connected as a current output node (D). The gates of the input and output transistors are connected together and to the common node (A) of the input transistor and the current source. A control transistor (M2) has its conduction channel connected between the other side of the output transistor and the first voltage supply node. The control transistor switches the output transistor by controlling the output transistor's gate-to-source voltage. Also disclosed are modified versions which include a circuit (20) designed for greater accuracy in the output and a circuit (22) designed for digital-to-analog conversion functions.

4 Claims, 3 Drawing Figures

FIELD-EFFECT TRANSISTOR CURRENT SWITCHING CIRCUIT

TECHNICAL FIELD

The present invention relates generally to electronic switching circuits and more particularly to current switching integrated circuits which selectively enable current flow in response to a signal voltage.

BACKGROUND OF THE INVENTION

Current switching circuits selectively enable current flow in response to a control signal voltage. Some circuits, for example digital-to-analog converters and voltage controlled oscillators, require highly accurate current switching circuits for their input. A number of different current switching circuits are known, both for field-effect and for bipolar transistor implementations. Those which are designed for field-effect transistor implementation typically have their switching speed limited by the time constants of various internal nodes due to the required charging time for parasitic capacitances. Moreover, these time constants are likely to change significantly with process variations from one wafer to the next in manufacture, thus making it difficult to control the operating parameters of the circuit. Another problem with field-effect transistor circuits is the coupling of switching transients to the output through parasitic capacitances of the transistors. Efforts to avoid these shortcomings usually involve the provision of additional devices in a cascode configuration to provide some isolation from the undesired effects. However, such measures make the resulting circuits more complex and costly.

SUMMARY OF THE INVENTION

The current switching arrangement in accordance with the present invention is a current mirror configuration having an input branch and an output branch. The current is switched by controlling the conduction path between a supply voltage node and one side of the conduction channel of an output transistor in the output branch. This arrangement reduces both the time constants of the switching nodes in the circuit and the parasitic coupling of switching transients to the output current.

DETAILED DESCRIPTION

Figure 1:
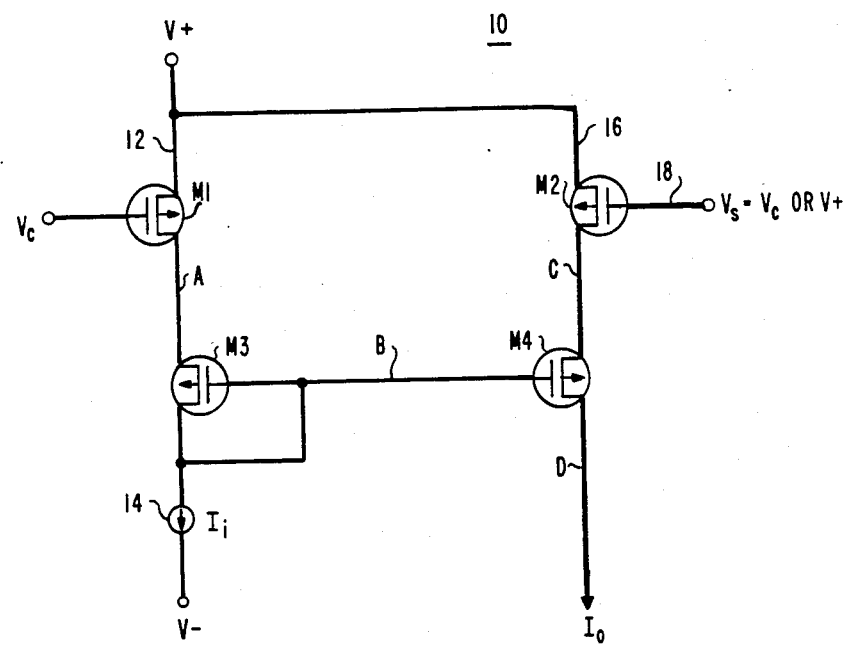
FIG. 1 of the drawings is a schematic circuit diagram of a current switching circuit in accordance with one example of the present invention.

The current switching circuit 10 of FIG. 1 is one example of an implementation of the invention. All the transistors in the circuit are three-terminal P-type conduction channel field-effect devices of the enhancement mode type with their bulk connected to a suitable positive voltage, such as a supply voltage node. In the interest of minimizing the complexity of the drawing, the bulk connections, which would be readily apparent to those skilled in the art, are not shown. The circuit 10 has an input current branch 12 made up of a triode-connected current-limiting transistor M1, an input transistor M3, and a current source 14 connected in series, respectively, between a positive supply voltage node V+ and a negative supply voltage node V−. The gate electrode of the current-limiting transistor M1 is connected to a suitable control voltage node $V_c$. The input transistor M3 has its gate electrode connected to its drain.

The circuit 10 also has an output current branch 16 which is made up of a switching transistor M2 and an output transistor M4 connected in series, respectively, between the positive supply voltage node V+ and an output current node D. The gate electrode of the output transistor M4 is connected to the gate of the input transistor M3 to establish currents in the input and output branches 12, 16 which are proportional to the relative conduction channel width-to-length dimensions of the respective transistors M1,M2, and the respective transistors M3,M4. For the present example, the transistors M1,M2,M3, and M4 may be considered to all be identical. The gate electrode of M2 is taken as the control electrode 18 for switching the current $I_o$ in the output branch 16 on and off. In most applications of the circuit 10, the current $I_o$ at the output current node D would be used to drive a load, which is not shown.

In considering the operation of the circuit 10, it is useful to begin with the assumption that the control voltage $V_c$, which is a reference voltage chosen to put the transistor M1 into a triode mode of operation, is for convenience taken as the same voltage as the negative supply voltage V−. It is also assumed that the voltage $V_s$ applied to the gate electrode of M2 is equal to $V_c$. This is the current ON condition. The nodes A and C are at the same voltage. The current $I_i$ in the input branch 12 is determined by the current source 14. The current $I_o$ in the output branch 16 is proportional to that in the input branch 12 in accordance with the dimensional proportionalities of the respective transistors M1,M2; M3,M4 of the input and output branches 12,16. Since the proportionality is unity in this particular example, $I_i = I_o$. If $V_s$ is now made equal to the positive supply voltage V+, then the current-limiting transistor M2 is turned OFF and the output current $I_o$ drops to zero. This leaves the node C at a voltage equal to the voltage of node B minus a threshold voltage of the output transistor M4. When $V_s$ is again switched to the V− voltage, M2 is turned on and begins to conduct current. This occurs because node C is pulled positive to turn M4 on.

The circuit 10 is capable of switching current very fast, while permitting very little coupling of switching transients to the output node D. The speed capability results from the fact that the nodes B and C are not required to change voltage very much in the course of the switching. The node B has a relatively large parasitic capacitance, but does not change its voltage. The node C is required to make relatively small voltage level excursions, from that of B minus a threshold voltage of M4 to near the positive supply voltage V+, and the transistor M2 may be made large to provide high switching speed and low resistance for supplying the needed current to the node C at the required speed without the introduction of undesirable side effects.

Since the current which is switched by M2 to low impedance node C comes directly from the voltage supply node 16, the time constant of the charging of node C can be readily kept sufficiently low for most purposes by appropriate choice of the size of M2.

There is very little coupling of switching transients of the circuit 10 to the output node D, since the coupling of the transients from the control electrode of M2 is primarily to the low impedance node C, from which very little can find its way to the high impedance output node D. Moreover, coupling to the output node D can be further reduced as desired by additional circuitry as will be discussed below.

Figure 2:
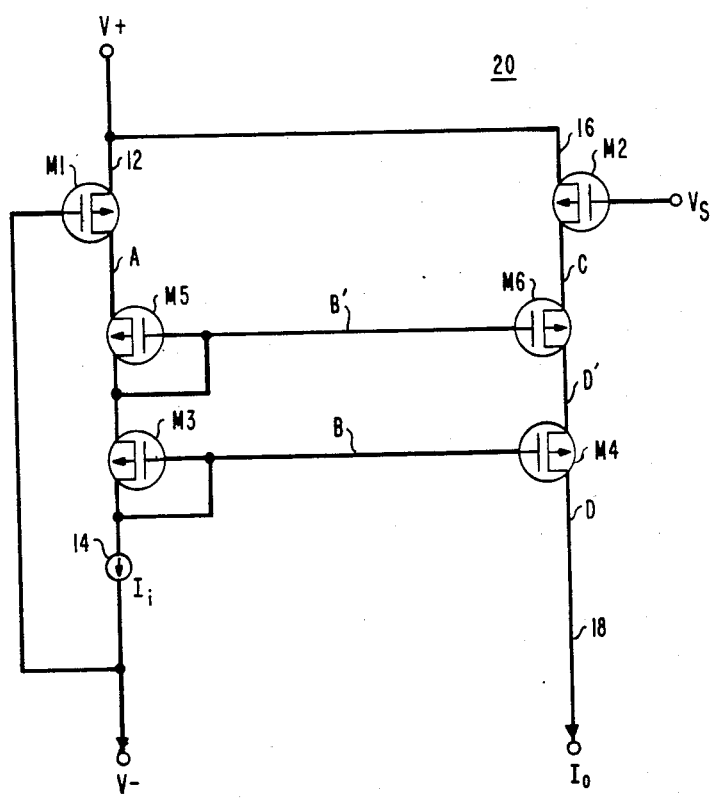
FIG. 2 is a schematic circuit diagram of a current switching circuit in accordance with another example of the present invention, in which the circuit of FIG. 1 is modified for higher precision in its output.

For implementations where it is important that the voltages at nodes B and D are equal, which would be desirable for a particularly precise current mirror, additional circuitry such as cascoded configurations may be provided. An example of such an arrangement is the modified circuit 20 shown in FIG. 2. Elements of the circuit 20 of FIG. 2 which correspond to those of the circuit 10 of FIG. 1 are designated by the same reference symbols. The circuit 20 is similar to the circuit 10 of FIG. 1, but has added to it the transistors M5 and M6. The device M5 is a cascoded input transistor. The device M6 is a cascoded output transistor. The effect of the additional current mirror stage formed by the cascoded transistors M5 and M6 is to make the voltages at nodes B' and D' substantially equal to each other. This improves the precision of the output current $I_o$ by insuring that the drain-to-source voltages of M5 and M6 are equal and by further reducing the coupling of any transients which might appear in the current at the common node of M6 and M2 from appearing in the output current $I_o$ at node D.

Figure 3:
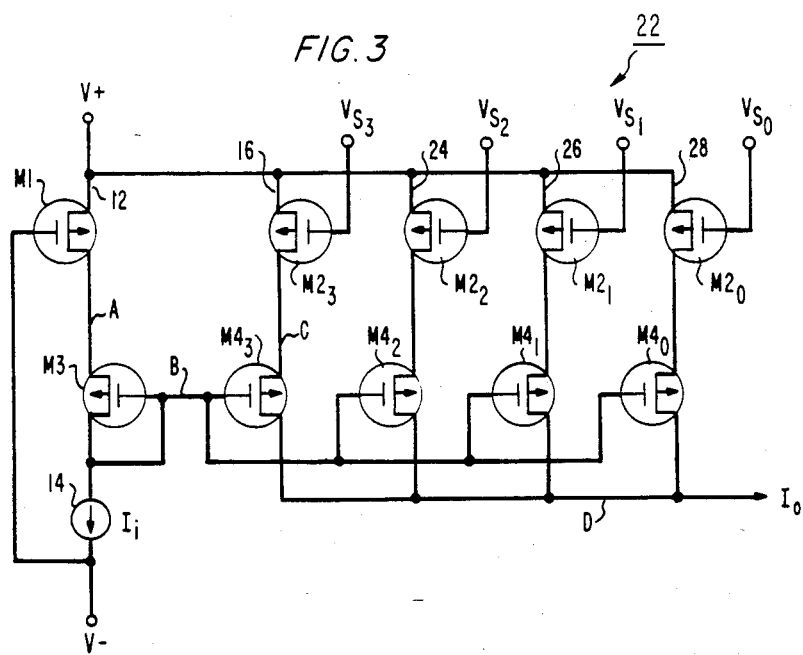
FIG. 3 is a schematic circuit diagram of a current switching circuit in accordance with a third example of the present invention, in which the circuit of FIG. 1 is modified to have additional output branches for digital-to-analog conversion purposes.

Another example of an implementation of the invention is the circuit 22 of FIG. 3, which is designed for digital-to-analog conversion functions. Again, elements which correspond to those of the circuit 10 of FIG. 1 are assigned similar reference symbols. It is seen that the circuit 22 is similar to the circuit 10, but has additional output branches 24,26,28 connected in parallel with the branch 16 and with each other to a common output. The output branches have respective switching transistors $M2_3$, $M2_2$, $M2_1$, and $M2_0$ connected between the positive supply voltage node V+ and one side of the conduction channel of the respective output transistors $M4_3$, $M4_2$, $M4_1$, and $M4_0$. The switching transistors $M2_3$, $M2_2$, $M2_1$, and $M2_0$ are operated by a train of switching voltages $V_{s3}$, $V_{s2}$, $V_{s1}$, and $V_{s0}$. The respective transistors of the output branches 24,26, and 28 have their conduction channel width-to-length ratios progressively scaled with respect to each other by a scaling factor of 2. Thus, the width-to-length ratios W/L of the switching transistors are given as $M2_3=8$, $M2_2=4$, $M2_1=2$, and $M2_0=1$. and those of the output transistors are given as $M4_3=8$, $M4_2=4$, $M4_1=2$, $M4_0=1$. The summed output current $I_o$ at the node D is may be used for analog signal reconstruction. There may be as many output branches as desired for a particular application.

While the above circuits use P channel devices of the enhancement mode type, it would be readily apparent to those skilled in the art to implement the invention with either N channel or P channel devices.

The control voltage $V_c$ to which the gate of the input branch current-limiting transistor M1 is connected may be any reference voltage node suitable for putting the transistor M1 into the triode mode for its function. A reference voltage is understood to be a voltage which is substantially constant in relation to the signal in the circuit. The current source 14 would generally be used to determine the current in the input branch 12.

The switching voltage node 18 may switch between various voltages which are effective to turn the transistor M2 ON and OFF, but it is preferable that the switching voltages be the control voltage $V_c$ and the positive supply voltage V+ in order to minimize the introduction of other effects in the circuit 10 which are likely to degrade its performance somewhat.

What is claimed is:

1. A current switching circuit, comprising:
   a first field-effect transistor having one side of its conduction channel connected to a first voltage supply node and its control electrode connected to a control voltage node;
   a second field-effect transistor having one side of its conduction channel connected to said first voltage supply node and its control electrode connected to a switching voltage node;
   a third field-effect transistor having one side of its conduction channel connected to the other side of the conduction channel of said first transistor;
   a fourth field-effect transistor having one side of its conduction channel connected to the other side of the conduction channel of said second transistor, the control electrodes of said third and fourth transistors being connected together and to the other side of the conduction channel of said third transistor, the other side of the conduction channel of said fourth transistor forming a current output node, and
   current source means for establishing a predetermined current in the conduction channels of said first and third transistors,
   said first and third transistors and said current source means forming an input current branch and said second and fourth transistors forming an output current branch.

2. The circuit as defined in claim 1, wherein said current source means comprises a current source having one side connected to the other side of said third transistor and having its other side connected to a second supply voltage node and to the control electrode of said first transistor.

3. A current switching circuit, comprising:
   a first field-effect transistor having one side of its conduction channel connected to a first voltage supply node and its control electrode connected to a control voltage node;
   a second field-effect transistor having one side of its conduction channel connected to said first voltage supply node and its control electrode connected to a switching voltage node;
   a third field-effect transistor having one side of its conduction channel connected to the other side of the conduction channel of said first transistor;
   a fourth field-effect transistor having one side of its conduction channel connected to the other side of the conduction channel of said second transistor, the control electrodes of said third and fourth transistors being connected together and to the other side of the conduction channel of said third transistor,
   a fifth field-effect transistor having one side of its conduction channel connected to the other side of the conduction channel of said third transistor;

a sixth field-effect transistor having one side of its conduction channel connected to the other side of the conduction channel of said fourth transistor, the control electrode of said sixth transistor being connected to the control electrode and the other side of the conduction channel of said fifth transistor, the other side of the conduction channel of said sixth transistor forming a current output node and a current source means for establishing a predetermined current in the conduction channels of said first, third, and fifth transistors.

4. A current switching circuit, comprising:

a first field-effect transistor having one side of its conduction channel connected to a first voltage supply node and its control electrode connected to a control voltage node;

a second field-effect transistor having one side of its conduction channel connected to said first voltage supply node and its control electrode connected to a switching voltage node;

a third field-effect transistor having one side of its conduction channel connected to the other side of the conduction channel of said first transistor;

a fourth field-effect transistor having one side of its conduction channel connected to the other side of the conduction channel of said second transistor, the control electrodes of said third and fourth transistors being connected together and to the second side of the conduction channel of said third transistor, the other side of the conduction channel of said fourth transistor forming a current output node;

at least one pair of additional transistors connected in series with each other between the one side of the conduction channel of said second transistor and the other side of the conduction channel of said fourth transistor to form an additional output branch, the control electrode of one transistor of said additional pair being connected to the control electrode of said fourth transistor, and the control electrode of the other transistor of said additional pair forming an additional control voltage node, and current source means for establishing a predetermined current in the conduction channels of said first and third transistors, said first and third transistors and said current source forming an input current branch, said second and fourth transistors forming a output current branch, and said additional pair of transistors forming a second output current branch.

* * * * *